United States Patent [19]
Lagowski et al.

[11] Patent Number: 6,114,865
[45] Date of Patent: Sep. 5, 2000

[54] DEVICE FOR ELECTRICALLY CONTACTING A FLOATING SEMICONDUCTOR WAFER HAVING AN INSULATING FILM

[75] Inventors: Jacek Lagowski; Alexander Savtchouk, both of Tampa; Nick Kochev, St. Petersburg; Charles Schraver, Palm Harbor, all of Fla.

[73] Assignee: Semiconductor Diagnostics, Inc., Tampa, Fla.

[21] Appl. No.: 09/295,919

[22] Filed: Apr. 21, 1999

[51] Int. Cl.[7] .................................................. G01R 31/02
[52] U.S. Cl. ............................................. 324/755; 324/765
[58] Field of Search ..................................... 324/755, 765, 324/754, 769; 438/14, 254

[56] References Cited

U.S. PATENT DOCUMENTS

| | | |
|---|---|---|
| 4,812,756 | 3/1989 | Curtis et al. . |
| 4,950,977 | 8/1990 | Garcia et al. . |
| 4,978,915 | 12/1990 | Andrews, Jr. et al. . |
| 5,216,362 | 6/1993 | Verkuil . |
| 5,394,101 | 2/1995 | Mitros . |
| 5,410,162 | 4/1995 | Tigelaar et al. . |
| 5,444,389 | 8/1995 | Hirae et al. .............................. 324/765 |
| 5,498,974 | 3/1996 | Verkuil et al. . |
| 5,773,989 | 6/1998 | Edelman et al. . |
| 5,815,000 | 9/1998 | Farnworth et al. ...................... 324/755 |
| 5,847,423 | 12/1998 | Yamamichi .............................. 257/296 |

*Primary Examiner*—Safet Metjahic
*Assistant Examiner*—Vincent Q. Nguyen
*Attorney, Agent, or Firm*—Fish & Richardson P.C.

[57] ABSTRACT

The invention relates to a device for contacting and electrically grounding semiconductor substrate coated with or otherwise having an insulating film positioned thereover. The device includes a chuck having a wafer support surface which holds the wafer and a scriber movably attached to the chuck. The scriber is configured to contact the wafer through an opening in the chuck and to produce a perforation through the insulating film. The device further includes an electrically conductive probe movably attached to the chuck and configured to be moved into an access opening in the chuck to contact the semiconductor substrate through the perforation. Thus, the device increases the accuracy of open circuit type measurements of the wafer surface potential, particularly for Kelvin and Monroe electrode measurements of electrical properties of insulating films on semiconductor substrates.

19 Claims, 9 Drawing Sheets

DEVICE FOR ELECTRICALLY CONTACTING A FLOATING SEMICONDUCTOR WAFER HAVING AN INSULATING FILM

BACKGROUND OF THE INVENTION

The invention relates to monitoring properties of insulating films including oxide layers of the type deposited or otherwise formed on a semiconductor substrate. In particular, the invention relates to monitoring those properties by accurately measuring the surface potential of the insulating film.

The majority of semiconductor devices including MOS (metal oxide semiconductor) capacitors, transistors, and corresponding integrated circuits incorporate insulating films (e.g., $SiO_2$) deposited or grown on semiconductor substrate wafers (e.g., silicon). Device manufacturing processes require precise monitoring of film properties, such as film capacitance, electric charges in the film, as well as, the charge at the semiconductor substrate film interface. Non-contact measurements of these properties are performed by placing an electrostatic charge on the film surface with a corona discharge in the air followed by measuring the corresponding change in the surface potential with a vibrating Kelvin or Monroe type electrode positioned near the surface of the film. During the measurement, the wafer is held, typically by vacuum suction, on an electrically conducting wafer chuck connected to the ground potential. For precise measurements, the semiconductor substrate potential is required to be the same as the ground potential. This is often difficult to achieve if a thick insulating film is present on the wafer back-surface contacting the chuck. Such a configuration with a wafer sandwiched between two isolating films is commonly referred to as the so-called "floating wafer arrangement." Electrostatic potential of such a wafer is susceptible to undesirable changes caused by various static related events interfering with the measurements. To improve the accuracy of these measurements, an electrically conductive probe can be used to penetrate very thin films (e.g., less than 200 Å) in order to make contact with the semiconductor substrate and equalize the wafer potential to the ground potential.

SUMMARY OF THE INVENTION

The invention relates to electrically contacting a semiconductor substrate having an insulating film disposed over at least a portion of the substrate. The substrate and insulating film together provide a semiconductor wafer. The invention improves the accuracy of electrical measurements used to characterize the quality of dielectric insulating films, such as oxide films, and their interface with the underlying semiconductor substrates, such as silicon.

In a general aspect of the invention, the device includes a scriber (e.g., a diamond scriber) movably attached to a chuck and configured to produce a perforation through the insulating film and an electrically conductive probe (e.g., a tungsten-carbide probe) electrically contacting ground, movably attached to the chuck and configured to contact the semiconductor substrate through the perforation. By "chuck," it is meant any workpiece or tool for holding or supporting the semiconductor substrate. Both the scriber and probe are movably attached to the chuck (e.g., a motorized chuck) which holds the semiconductor substrate.

Embodiments of the device can also include one or more of the following features. The probe and scriber are mounted onto a rotatable cylinder at angularly offset positions, for example, at diametrically opposing positions. The rotatable cylinder is positioned within the opening of the chuck. It is appreciated that, as used herein, "rotatable cylinder" includes other rotatably shaped elements including those that are polygonal (e.g., rectangular) in shape. In a neutral position (prior to measurement) the scriber and the probe do not touch the wafer. To activate the device, the rotatable cylinder is rotated to bring the scriber into contact with the substrate though an access opening in the chuck. Upon further rotation, the scriber creates the perforation in the insulating layer deposited on the substrate. Through even further rotation, the tip of the probe contacts the semiconductor substrate through the perforation and brings the floating substrate potential to the ground potential. The device remains activated (i.e., the probe contacts the substrate) during measurement.

The rotatable cylinder includes a resilient element (e.g., a spring) positioned between the probe and the scriber. The resilient element serves to apply an outward force in a direction normal to the axis of the rotation. The resilient element ensures reliable mechanical contact between the scriber and wafer, as well as, reliable electrical contact between the probe and substrate. The access opening serves as a vacuum port for removing by suction, debris produced when the perforation is formed. The device includes an actuator configured to engage and rotate the rotatable cylinder, thereby moving the scriber and probe so that the probe electrically contacts and grounds the substrate through the perforation during the measurement period and moves the probe out of contact with the substrate after the measurement is completed. The chuck is motorized to align the device actuator and the cylinder.

In another aspect, the invention features a method for electrically grounding a semiconductor substrate having an insulating film disposed over at least a portion of the semiconductor substrate.

The method includes the step of providing (1) a chuck having a wafer support surface which holds the substrate, (2) a scriber movably attached to the chuck, and (3) an electrically conductive probe for contacting and electrically grounding the semiconductor substrate, the probe being movably attached to the chuck. In the method, the wafer is positioned on the chuck, the insulating film is perforated to form a perforation, and the probe is positioned to contact the semiconductor substrate through the perforation.

The method of the invention can include one or more of the following features. Perforating the insulating layer includes contacting the insulating layer with a scriber.

Among other advantages, the device and method enables reliable, efficient, and accurate measurement and characterization of the insulating film and its interface with the underlying semiconductor substrate, particularly when the insulating layer used to coat the semiconductor substrate is relatively thick and hard. This has been accomplished by recognizing that a scriber formed of a material harder than the insulating film can be used to perforate the film before contacting the semiconductor with a relatively soft electrically conductive probe. This approach is particularly well-suited for eliminating random potential fluctuation commonly experienced in characterizing floating wafer arrangements, in which the insulating film is deposited or otherwise formed on both top and bottom surfaces of the semiconductor substrate.

Other advantages and features of the invention will be apparent from the following description and from the claims.

DETAILED DESCRIPTION

Figure 1:
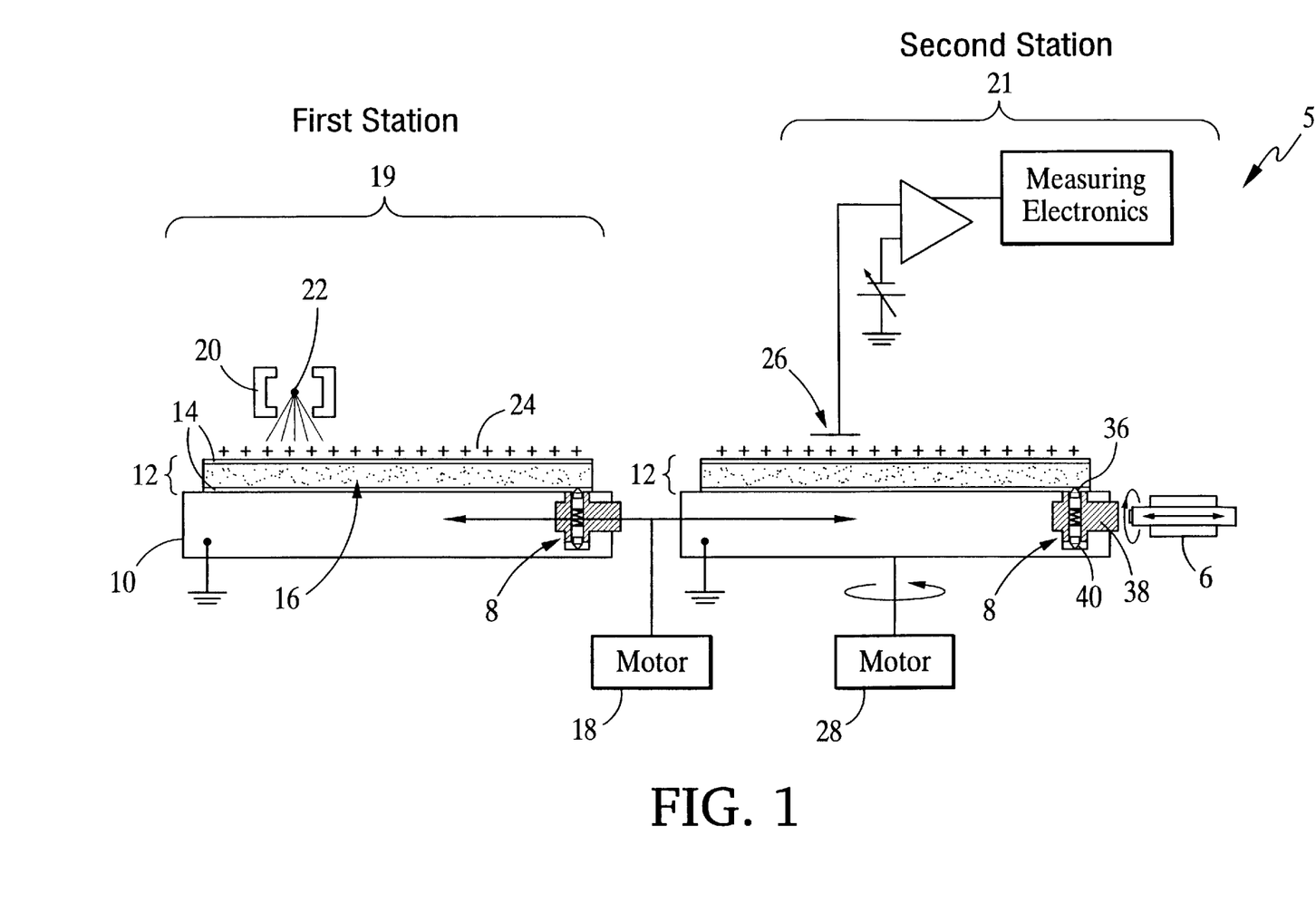
FIG. 1 is a schematic representation of a system including a device of the invention in operation.

Referring to FIG. 1, a system 5 includes a device 8 for electrically contacting and grounding a semiconductor substrate 16 of a semiconductor wafer 12. Wafer 12, as shown supported on an upper surface of a chuck 10, is of the type having an insulator film or coating 14 formed on the semiconductor substrate 16. Insulator coating 14, here a silicon dioxide coating, has a thickness up to about and 10,000 Å. In this embodiment, system 5 is used to measure surface potential with a contact potential measuring probe 26 (Kelvin or Monroe type electrodes) and includes a charge depositor 20 having a high voltage corona wire 22 for depositing a blanket of corona charge 24 over insulator coating 14. System 5 includes a first station 19 for depositing charge and a second station 21 having measuring probe 26 for measuring the corona-charged surface of insulator coating 14 relative to substrate 16. A motor 18 is used to shuttle chuck 10, which holds wafer 12, between first station 19 and second station 21. At second station 21, a motor 28 rotates wafer 12 under probe 26 so that various regions of the corona-charged surface can be measured. For this measurement and for corona charging as well, substrate 16 is electrically grounded using device 8 in a manner described in greater detail below.

Figure 2:
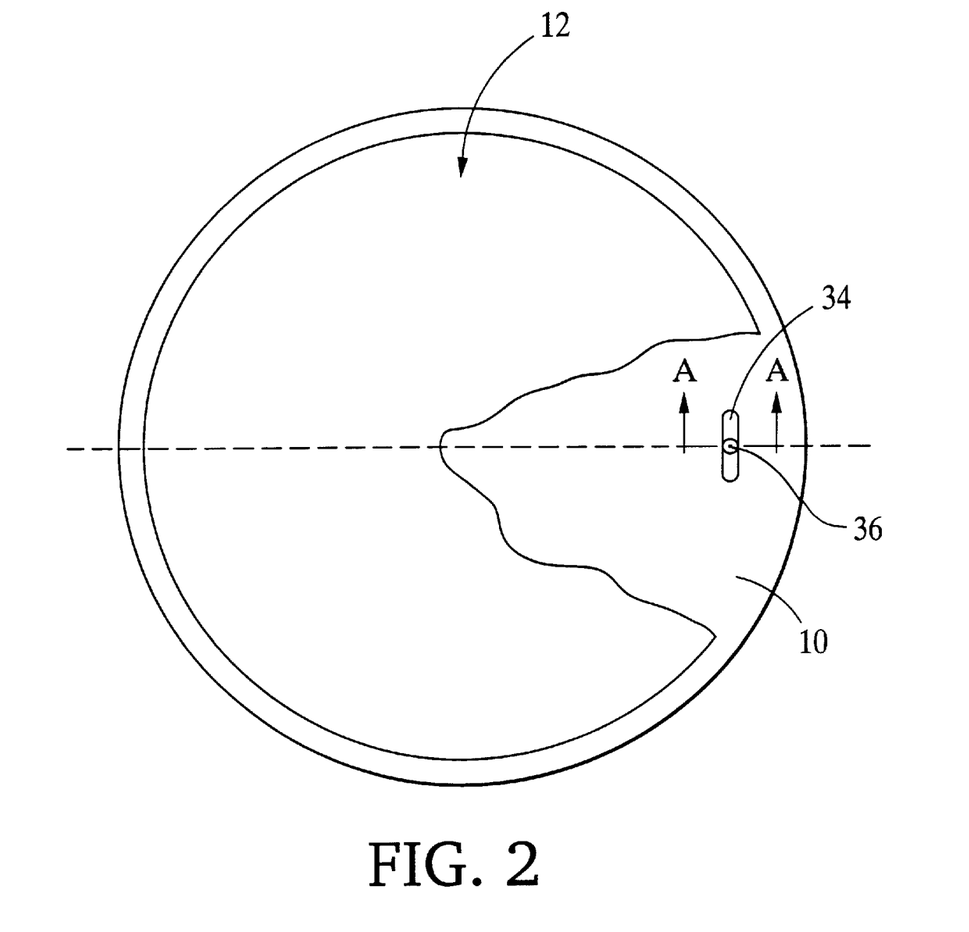
FIG. 2 is a top view of the device shown in FIG. 1, with a portion of the wafer removed.
Figure 3:
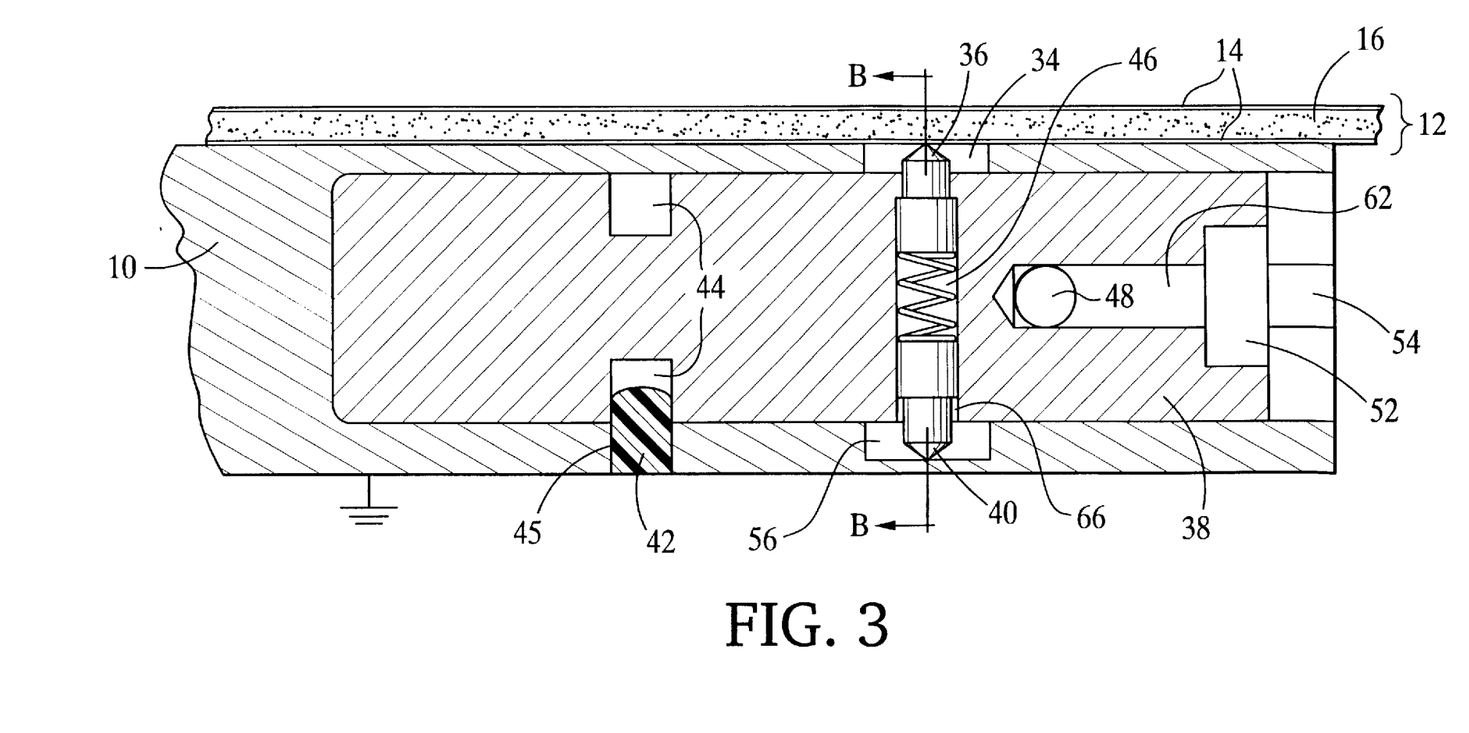
FIG. 3 is a cross-sectional view of the device along line A—A of FIG. 2.
Figure 4:
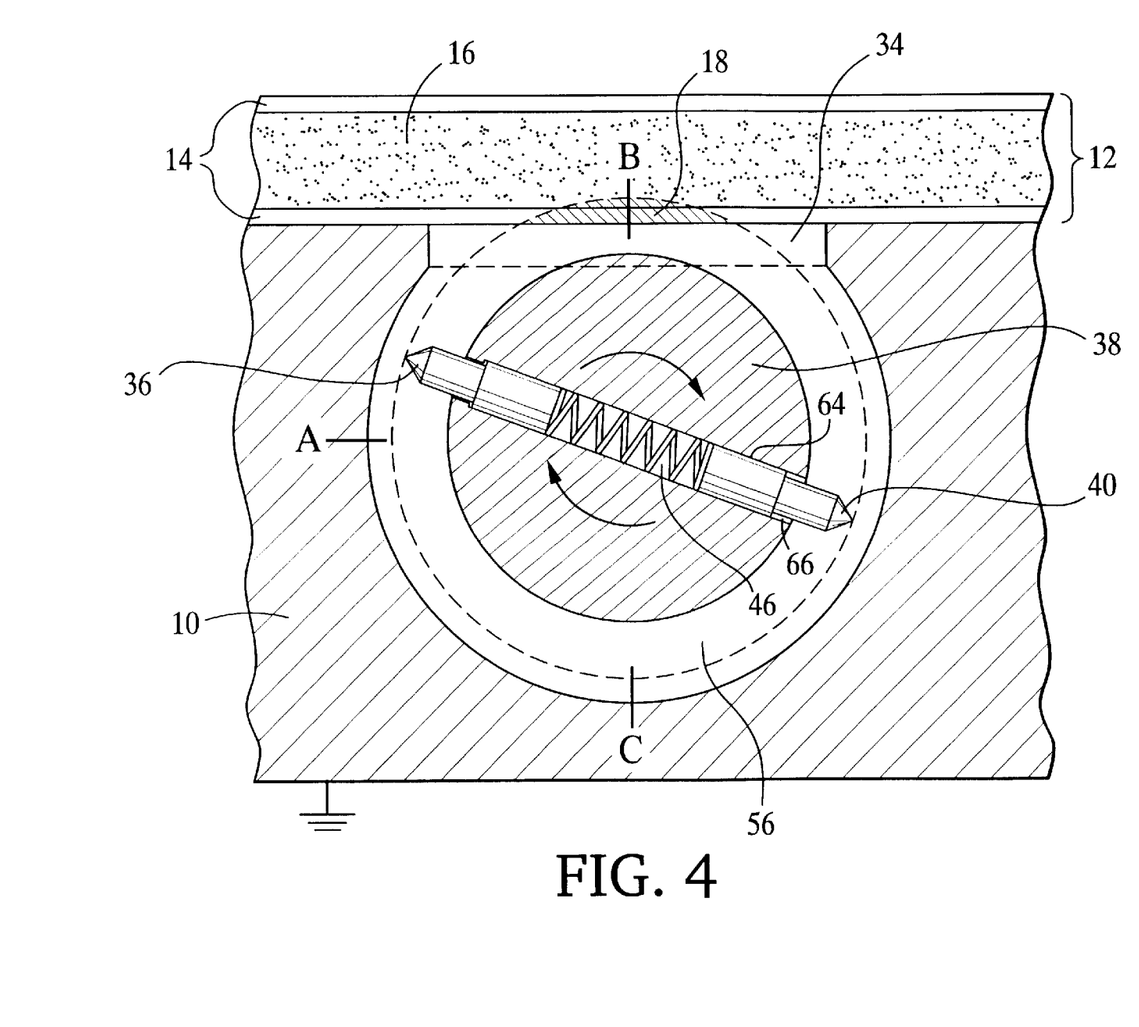
FIG. 4 is a cross-sectional view of the device along line B—B of FIG. 3.

Referring to FIGS. 2, 3 and 4, wafer chuck 10 includes an internal volume or cavity 31 (see FIG. 5) for receiving a rotatable steel cylinder 38, on which scriber 36 and an electrically conductive tungsten probe 40 are mounted at diametrically opposing positions. Wafer chuck 10 includes a circumferential channel 56 within which the tips of scriber 36 and probe 40 are disposed when cylinder 38 is rotated.

To electrically ground substrate 16, chuck 10 with attached device 8 is positioned by motors 18 and 28 in such a way that rotatable cylinder 38 faces and can engage actuator 6. In this position the actuator couples with the cylinder 38 and rotates it clock-wise around the longitudinal axis of the cylinder.

Rotation of cylinder 38 moves scriber 36 which is mounted in the cylinder from an initial position A toward a position B and further to a position C. During this motion, scriber 36 enters an access opening 34 in chuck 10 and produces a perforation 18 (e.g., 1 mm long) through insulating layer 14 which faces chuck 10, thereby exposing semiconductor substrate 16. Further rotation of cylinder 38 moves a conducting probe 40 into perforation 18 producing electrical contact between the probe 40 and semiconductor substrate 16.

Probe 40 rests in final position B to electrically ground the substrate 16 through the following conducting path: substrate 16 is connected to conducting probe 40 which is connected to conducting cylinder 38 which, in turn, is connected to conducting chuck 10 connected to the ground potential.

After rotation is completed, actuator 6 decouples from cylinder 8 and probe 40 remains in the substrate 16 grounding position B until a desired common-charging-measuring cycle is completed. When completed, chuck 10 is moved by motors 18 and 28 to a position where cylinder 8 faces actuator 6. Actuator 6 couples with cylinder 38 and rotates it counter-clockwise around the cylinder axes until scriber 36 is returned to its initial position A. System 5 is then ready for loading of a new wafer from wafer chuck 10 and for subsequent loading and measuring of the new wafer.

Figure 5:
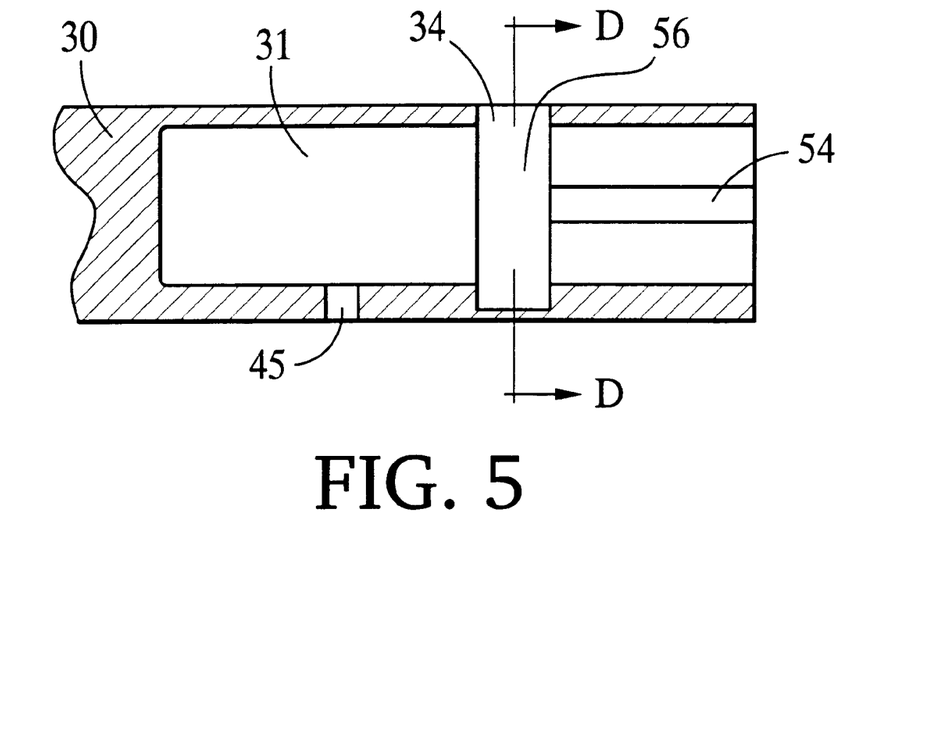
FIG. 5 is a cross-sectional view of a chuck of the device in FIG. 3.
Figure 6:
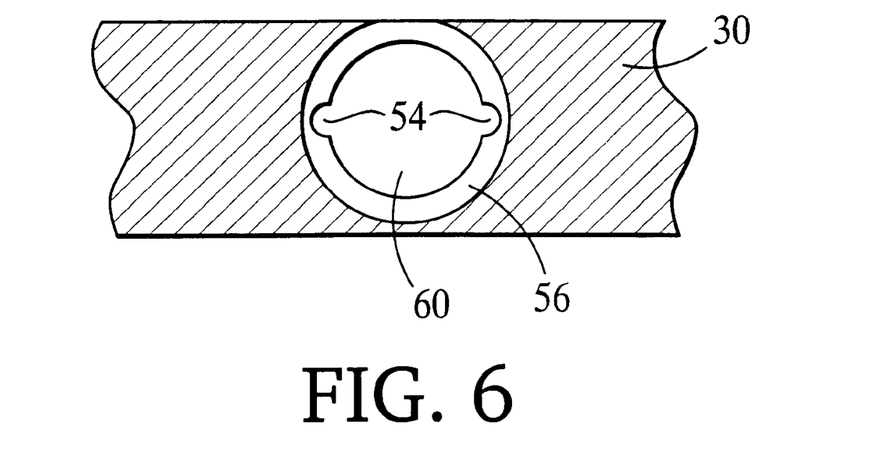
FIG. 6 is a cross-sectional view of the chuck along line D—D of FIG. 5.

Referring to FIGS. 5 and 6, slots 54 are formed along opposing sides of wafer chuck 10 and extend longitudinally toward a proximal end of chuck 10. Slots 54 facilitate the assembly of and minimize possible damage to scriber 36 and probe 40 as cylinder 38 is installed within wafer chuck 10. As will be described in greater detail below, slots 54 serve an additional important function. Specifically, because slots 54 are contiguous with access opening 34 and channel 56 of wafer chuck 10, slots 54 are also used to remove debris produced during the forming of perforation 58.

Figure 7:
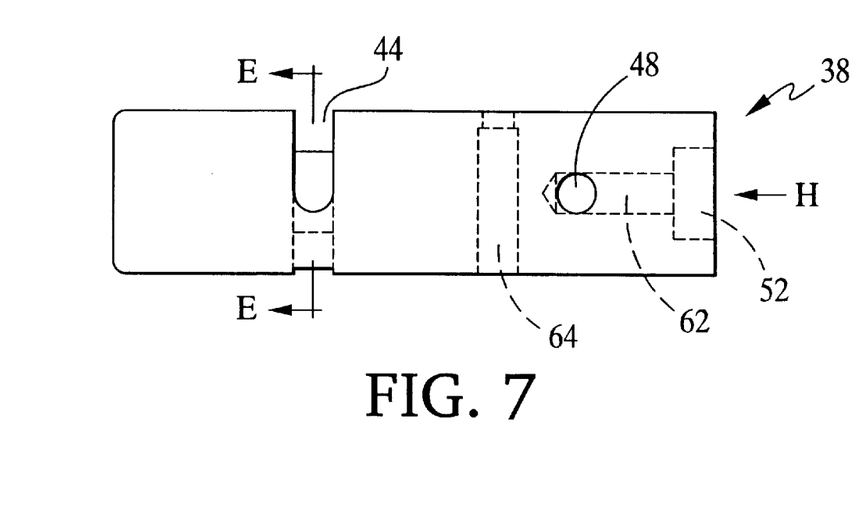
FIG. 7 is a side view of the rotatable cylinder of the device.
Figure 8:
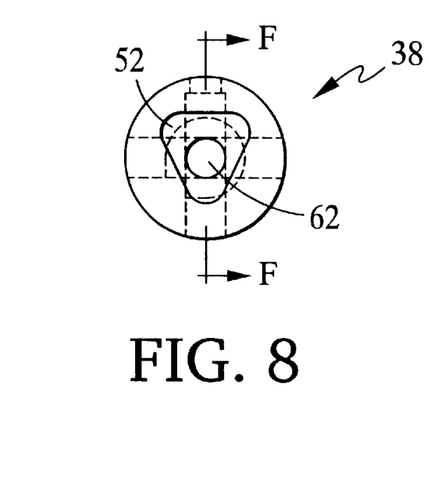
FIG. 8 is an end view of the rotatable cylinder as seen from arrow H of FIG. 7.
Figure 9:
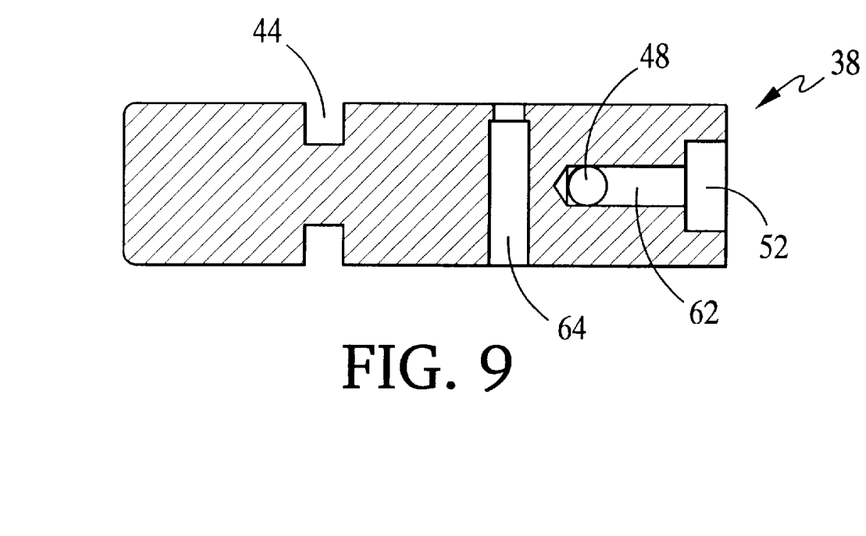
FIG. 9 is a cross-sectional view of the rotatable cylinder along line F—F of FIG. 8.
Figure 10:
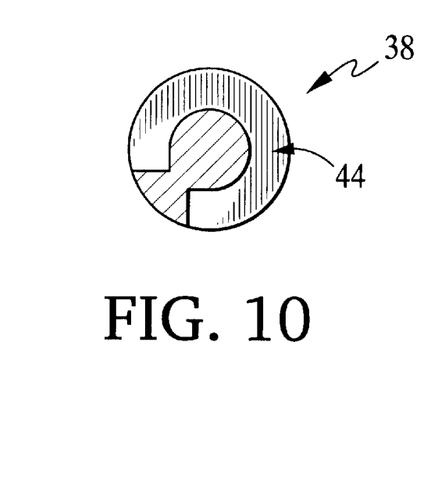
FIG. 10 is a cross-sectional view of the rotatable cylinder along line E—E of FIG. 7.

Referring again to FIGS. 3 and 4, rotatable cylinder 38 includes a bore 64 (FIGS. 7 and 9) which extends transversely to the axis of rotatable cylinder 38. Referring again to FIGS. 3 and 4, bore 64 receives scriber 36, probe 40, and a spring 46 positioned between the scriber and the probe 40. Spring 46 provides an outwardly directed force to scriber 36 and probe 40 to ensure reliable mechanical contact between the scriber and wafer, as well as, reliable electrical contact between probe 40 and semiconductor substrate 16. Thus, spring 46 is selected to have a bias to apply a sufficient force to scriber 36 for penetrating the thickness of insulator coating 14, as well as to apply a force to probe 40 for electrically contacting substrate 16. Springs which apply various levels of force may be substituted within bore 46 depending on the thickness of coating 14.

To assemble scriber 36 and probe 40 within rotatable cylinder 38, the scriber is first inserted into bore 64, followed by insertion of spring 46, and then insertion of probe 40 (FIG. 3). A punch 66 is then used to stake scriber 36, spring 46, and probe 40 within bore 64 (FIGS. 3 and 4).

The position of rotatable cylinder 38 is rotatably fixed in wafer chuck 30 by first aligning a circumferential groove 44 formed at a distal end of cylinder 38 with a hole 45 extending from an outer surface of wafer chuck 30 to internal cavity 31. Groove 44 extends about 270° around the circumference of cylinder 38, limiting the rotation of cylinder 38 about its central axis when installed in housing 30 by index pin 42 (FIG. 3). An index pin 42 is then positioned through hole 45 and into groove 44 to secure cylinder 38 within internal cavity 31.

Rotatable cylinder 38 secured within wafer chuck 30 in this manner allows for efficient removal of debris created during the forming of perforation 18 in insulator coating 14. In particular, rotatable cylinder 38 includes a suction passage 48 extending through cylinder 38 and extending transversely to both the axis of the cylinder and bore 64. Passage 48 is contiguous with slots 54 and channel 56 of wafer chuck 30 (FIGS. 5 and 6) when scriber 36 is in position to perforate coating 14 of wafer 12. Passage 48 intersects a central passage 62 which extends to a recess 52 at the proximal end of the rotatable cylinder. When vacuum is applied at the proximal end of the cylinder, debris from access opening 34 is drawn through channel 56 and through slots 54 of wafer chuck 30 (FIGS. 5 and 6). The debris is then drawn through suction passage 48 and central passage 62 of rotatable cylinder 38.

Figure 11:
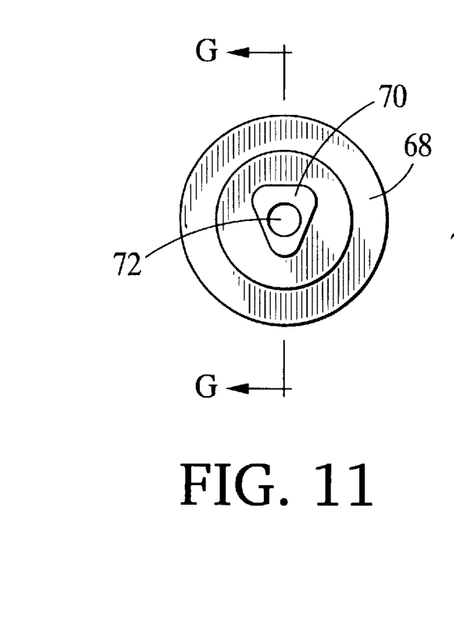
FIG. 11 is an end view of an actuator for rotating the rotatable cylinder.
Figure 12:
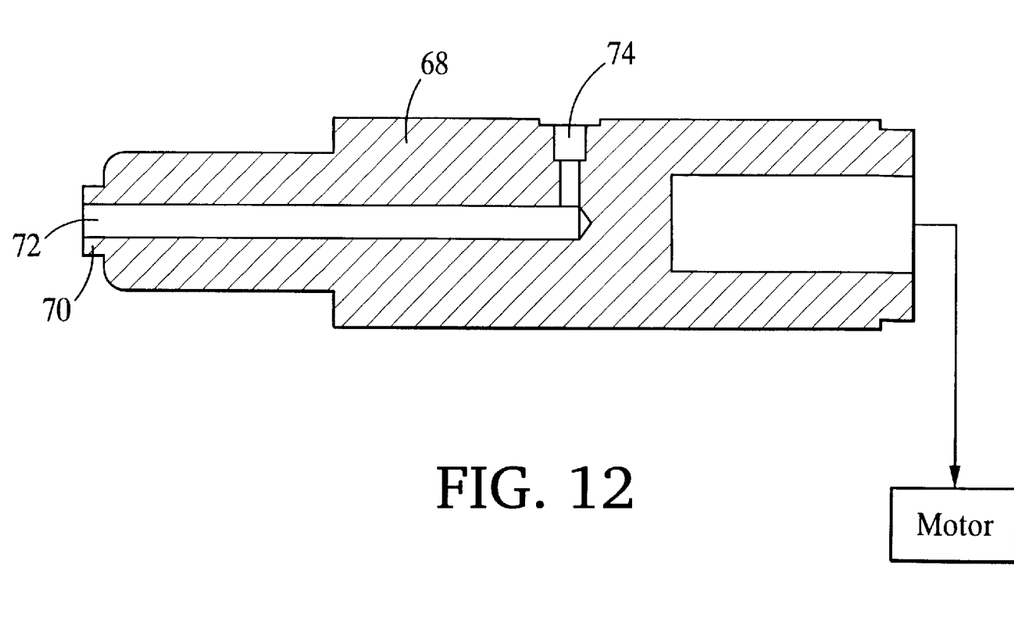
FIG. 12 is a cross-sectional view of the actuator along line G—G of FIG. 11.

Referring to FIGS. 11 and 12, rotatable cylinder 38 includes a triangular recess 52 for engaging a key 70 formed at the end of an actuator 68, which is used to rotate cylinder 38. Key 70 also includes a vacuum passage 72 contiguous with central passage 62 of cylinder 38 when the actuator engages and rotates cylinder 38. Vacuum passage 72 leads to a vacuum port 74, where debris exits actuator 68. Actuator 68 is connected to a mechanism (not shown) which includes a motor 76. The mechanism extends, retracts, and rotates actuator 68 during operation of device 10.

Figure 13A:
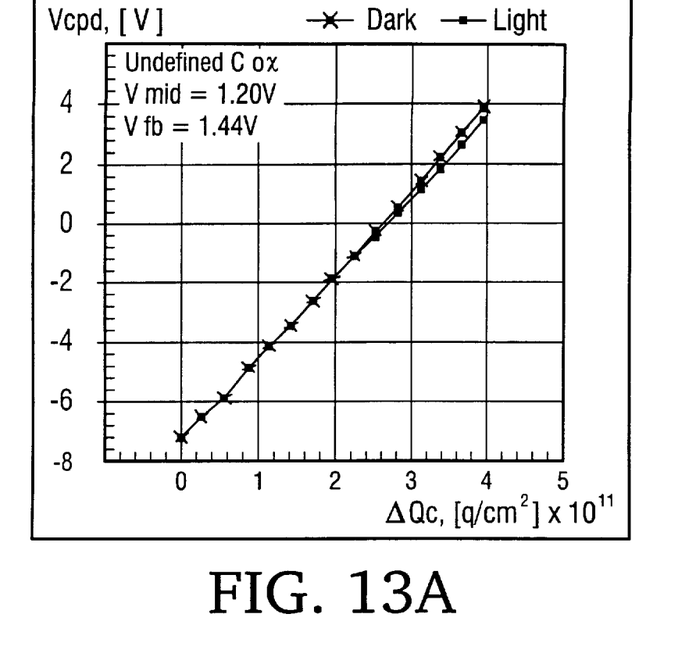
FIGS. 13A and 13B are graphs of the contact potential difference on a wafer surface as a function of the applied charge with and without using the device of the invention to electrically ground the wafer, respectively.
Figure 13B:
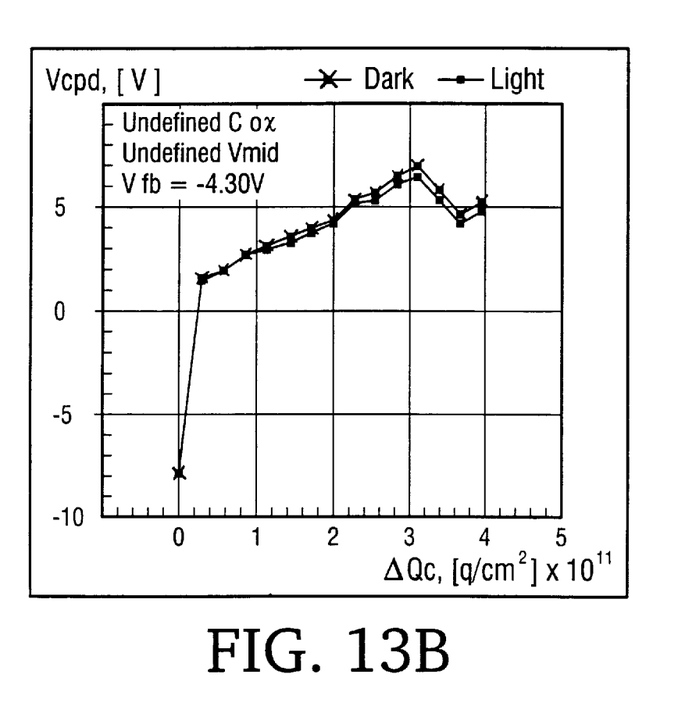
Figure 14A:
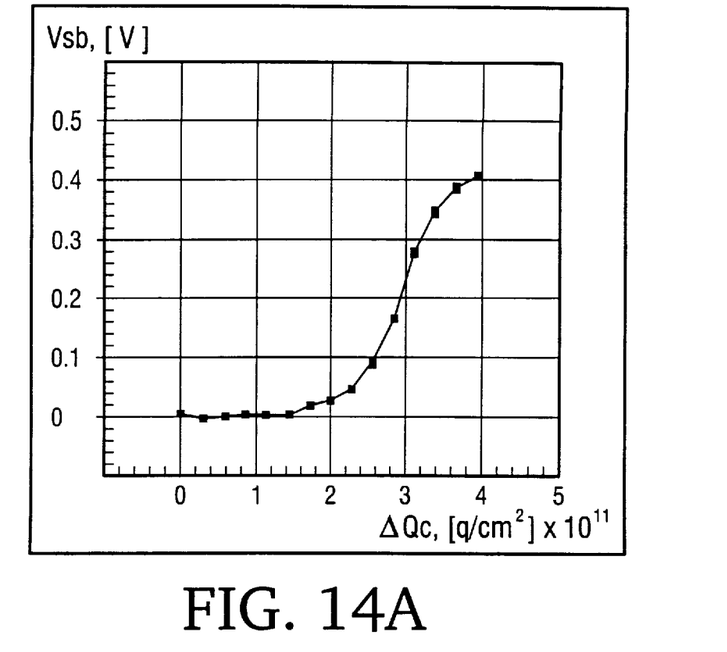
FIGS. 14A and 14B are graphs of the surface barrier potential of a wafer as a function of the applied charge with and without using a device of the invention to electrically ground the wafer, respectively.
Figure 14B:
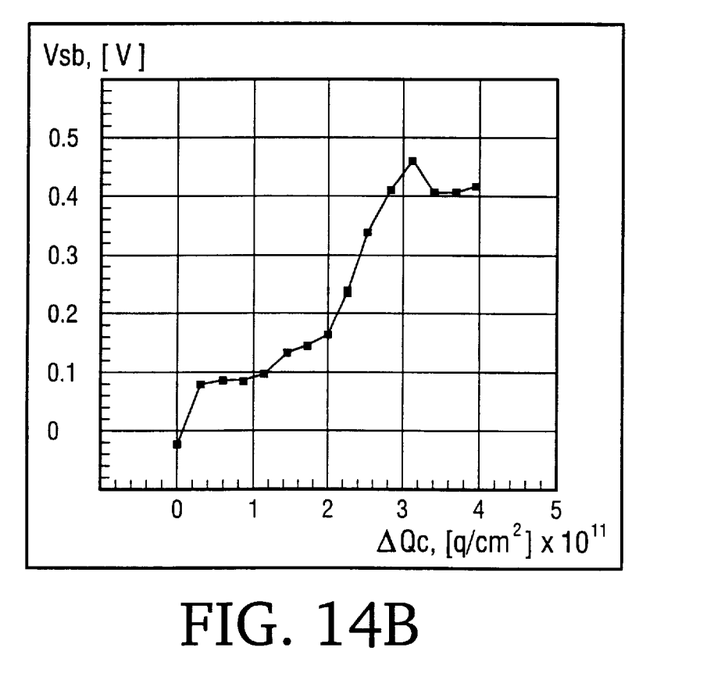

Referring to FIGS. 13A, 13B, 14A, and 14B, the system and device described above were used to measure the contact potential difference (FIGS. 13A and 13B) and the surface barrier potential (FIGS. 14A and 14B) of a wafer having a 100 nm-thick silicon dioxide insulating layer on the top and bottom of a semiconductor substrate. As shown in FIGS. 13A and 14A, a smooth relationship between contact potential voltage and the surface barrier in response to corona charging charge was achieved, as expected, when the device was used to ground the wafer. The surface potential barrier $V_{SB}$ is an important parameter determined as a difference between $V_{CPD}$ (dark) and $V_{CPD}$ (light). These smooth relationships enable precise determination of the quantitative parameters for characterizing the insulating film and the film/substrate interface. However, FIGS. 13B and 14B indicate that, without grounding, the relationships were not smooth, but chaotic. In this case no reliable determination of electrical properties of the insulator or the interface can be achieved.

Other embodiments are within the scope of the claims.

What is claimed is:

1. A device for electrically contacting a semiconductor substrate having an insulating film disposed over at least a portion of the semiconductor substrate, the device comprising:
   a chuck having a wafer support surface which holds the wafer;
   a scriber movably attached to the chuck, the scriber configured to produce a perforation through the insulating film; and
   an electrically conductive probe electrically contacting ground and movably attached to the chuck, the conductive probe configured to contact the semiconductor substrate through the perforation.

2. The device of claim 1, further comprising a motor configured to move the chuck within a plane and align the rotatable cylinder and the actuator.

3. The device of claim 1, wherein the probe comprises tungsten carbide.

4. The device of claim 1, wherein the scriber comprises diamond.

5. The device of claim 1, wherein the chuck is formed of an electrically conductive material and is electrically grounded.

6. The device of claim 1, wherein the rotatable cylinder is formed of an electrically conductive material and is electrically grounded.

7. The device of claim 6, wherein the probe is electrically connected to the rotatable cylinder and is electrically grounded.

8. The device of claim 1, wherein the chuck defines an opening, and the device further comprising a rotatable cylinder positioned within the opening of the chuck, a longitudinal axis about which the rotatable cylinder rotates, the scriber and the probe being mounted on the rotatable cylinder.

9. The device of claim 8, wherein the chuck includes an access opening extending from the opening within which the rotatable cylinder is positioned to the support surface, and the rotatable cylinder is configured such that the probe, in a first position, contacts the semiconductor substrate through the access opening and the perforation when the scriber is in a diametrically opposing second position.

10. The device of claim 9, wherein the access opening in the chuck serves as a vacuum port for suctioning debris from the production of the perforation.

11. The device of claim 9, further comprising an actuator configured to engage and rotate the rotatable cylinder and move the scriber to the first position to produce the perforation and to further rotate the cylinder to cause the probe to contact the semiconductor substrate through the perforation.

12. The device of claim 8, wherein the probe and scriber are mounted onto the rotatable cylinder at angularly offset positions.

13. The device of claims 12, wherein the probe and the scriber are mounted at diametrically opposing positions of the rotatable cylinder.

14. The device of claim 13, wherein the rotatable cylinder includes a longitudinal axis about which the rotatable cylinder rotates and a bore having an axis substantially normal to the longitudinal axis of the rotatable cylinder, the probe and scriber being disposed within the bore.

15. The device of claim 13, further comprising a resilient member disposed between the probe and the scriber.

16. The device of claim 15, wherein the resilient member is a spring.

17. A method for electrically grounding a semiconductor substrate, having an insulating film disposed over at least a portion of the substrate, the method comprising:
   providing (1) a chuck having a wafer support surface which holds the substrate, (2) a scriber movably attached to the chuck, and (3) an electrically conductive probe for contacting and electrically grounding the semiconductor substrate, the probe movably attached to the chuck;
   positioning the wafer in a fixed position on the chuck;
   perforating the insulating film to form a perforation; and
   positioning the probe to contact the semiconductor substrate through the perforation.

18. The method of claim 17 further comprising, after positioning the probe, retaining the probe in contact with the semiconductor substrate with the substrate held on the chuck to allow electrical measurement of the substrate and insulating film.

19. The method of claim 17, wherein perforating the insulating layer of the supported wafer includes contacting the insulating layer with a scriber.

* * * * *